(12) United States Patent
Kang et al.

(10) Patent No.: US 10,877,525 B2
(45) Date of Patent: Dec. 29, 2020

(54) ROLLABLE DISPLAY

(71) Applicant: LG DISPLAY CO., LTD., Seoul (KR)

(72) Inventors: Chounsung Kang, Goyang-si (KR); Geunchang Park, Goyang-si (KR); Jungkyu Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 184 days.

(21) Appl. No.: 15/607,109

(22) Filed: May 26, 2017

(65) Prior Publication Data
US 2017/0344073 A1 Nov. 30, 2017

(30) Foreign Application Priority Data

May 30, 2016 (KR) .................. 10-2016-0066553

(51) Int. Cl.
| | |
|---|---|
| *G06F 1/16* | (2006.01) |
| *G09F 9/30* | (2006.01) |
| *H05K 1/14* | (2006.01) |
| *H05K 1/18* | (2006.01) |
| *G06F 3/01* | (2006.01) |
| *H01L 27/32* | (2006.01) |
| *H01L 51/50* | (2006.01) |
| *H04M 1/02* | (2006.01) |
| *H05K 1/02* | (2006.01) |

(52) U.S. Cl.
CPC .......... *G06F 1/1679* (2013.01); *G06F 1/1601* (2013.01); *G06F 1/1652* (2013.01); *G09F 9/301* (2013.01); *G06F 1/1637* (2013.01); *G06F 3/01* (2013.01); *H01L 27/3244* (2013.01); *H01L 51/50* (2013.01); *H01L 2251/5338* (2013.01); *H04M 1/0268* (2013.01); *H05K 1/028* (2013.01); *H05K 1/147* (2013.01); *H05K 1/189* (2013.01); *H05K 2201/10128* (2013.01)

(58) Field of Classification Search
CPC .... G06F 1/1679; G06F 1/1601; G06F 1/1652; G09F 9/301
See application file for complete search history.

(56) References Cited

U.S. PATENT DOCUMENTS

| | | | |
|---|---|---|---|
| 6,431,271 B1 * | 8/2002 | Thomeer ............... | E21B 17/206 166/77.51 |
| 2003/0160892 A1 * | 8/2003 | Tamura ............... | H04N 5/2251 348/333.07 |

(Continued)

*Primary Examiner* — Antonio Xavier
(74) *Attorney, Agent, or Firm* — Seed Intellectual Property Law Group LLP

(57) ABSTRACT

A rollable display comprises a flexible display panel; at least one BRC member having one end coupled with an edge of the flexible display panel; a roller assembly having a roller coupled with another end of the BRC member and a motor for rotating the roller, the roller assembly being ascended while rolling the BRC member onto the roller when the motor is rotated in a first direction, and being descending while unrolling the BRC member from the roller when the motor is rotated in a second direction opposite to the first direction; and a panel guide part connected to the roller assembly and moved along with the roller assembly; wherein the flexible display panel is rolled onto the panel guide part when the roller assembly and the panel guide part ascend, and is unrolled from the panel guide part when the roller assembly and the panel guide part descend.

20 Claims, 17 Drawing Sheets

(56) References Cited

U.S. PATENT DOCUMENTS

| | | | |
|---|---|---|---|
| 2011/0041369 A1* | 2/2011 | Uy | G09F 11/12 |
| | | | 40/514 |
| 2014/0230949 A1* | 8/2014 | Daton-Lovett | B64G 1/222 |
| | | | 138/177 |
| 2014/0292672 A1* | 10/2014 | Choi | G06F 1/3262 |
| | | | 345/173 |
| 2016/0205791 A1* | 7/2016 | Kim | G06F 1/1652 |
| | | | 361/679.01 |
| 2016/0209879 A1* | 7/2016 | Ryu | G06F 1/1601 |
| 2016/0223131 A1* | 8/2016 | Daton-Lovett | H01Q 1/087 |
| 2016/0324014 A1* | 11/2016 | Lee | G06F 1/1652 |
| 2017/0060183 A1* | 3/2017 | Zhang | H01L 51/5237 |
| 2017/0061753 A1* | 3/2017 | Khoshkava | G06F 3/016 |
| 2017/0309226 A1* | 10/2017 | In | G09G 3/20 |
| 2018/0210559 A1* | 7/2018 | Xia | G06F 1/1688 |
| 2018/0371849 A1* | 12/2018 | Daton-Lovett | B29C 65/1435 |

\* cited by examiner (a)

(b)

(a)

(b)     (c)

(a)

(b)

(c)

ROLLABLE DISPLAY

This application claims the priority benefit of Korean Patent Application No. 10-2016-0066553 filed on May 30, 2016 which is incorporated herein by reference for all purposes as if fully set forth herein.

BACKGROUND

Technical Field

This disclosure relates to a rollable display.

Description of the Related Art

With the development of information technology, the market for displays, which act as an intermediary between users and information communication devices, is growing. Thus, the use of display devices such as organic light-emitting displays (OLEDs), liquid crystal displays (LCDs), and plasma display panels (PDPs) is increasing.

Among them, the organic light-emitting diode displays are self-emissive, and hence may have lower power consumption and a thinner profile than the liquid crystal displays, which require a backlight. Also, the organic light-emitting diode displays offer additional advantages, such as a wide viewing angle and a fast response time. The techniques for manufacturing the organic light-emitting diode displays have been developed to an extent that mass production of large screens is possible. Accordingly, the organic light-emitting diode displays are expanding a market share while competing with the liquid crystal displays.

Pixels of an organic light-emitting diode display comprise organic light-emitting diodes (hereinafter, "OLEDs"), which are self-emissive. The organic light-emitting diode display may be classified as a variety of types depending on various factors such as an emissive material, an emission method, an emission structure, and a driving method. The organic light-emitting diode displays may be classified as fluorescent emission devices or phosphorescent emission devices depending on the emission method, or classified as top emission devices or bottom emission devices depending on the emission structure. Also, the organic light-emitting diode displays may be classified into Passive Matrix OLEDs (PMOLEDs) and Active Matrix OLEDs (AMOLEDs) depending on the driving method.

Flexible displays have recently become commercially available. A flexible display can reproduce input images on the screen of a display panel including plastic OLEDs. The plastic OLEDs are formed on a bendable plastic substrate. The flexible displays can be implemented in various designs and offer benefits in portability and durability. The flexible displays may be implemented in various ways such as a bendable display, a foldable display, and a rollable display. Such flexible displays can be used in television sets, car displays, and wearable devices, as well as mobile devices such as smartphones and tablet PCs, and are broadening their range of applications.

A rollable display may be maintained or used by rolling or unrolling the display panel thereof as needed. It is desirable for the display panel to maintain an unrolled state when the user wants to use the display panel. Since the related art rollable display is not provided with a tool for maintaining the display panel in the unrolled state, the display panel can be rolled during use unintentionally. There is thus a problem that the convenience of the user is deteriorated due to the absence of the tool.

SUMMARY

This disclosure provides a rollable display which makes it easy to roll the flexible display panel up and down, and includes a structure capable of supporting the flexible display panel.

Embodiments relate to a rollable display comprising a flexible display panel; at least one Bistable Reeled Composite (BRC) member having one end coupled with an edge of the flexible display panel; a roller assembly having a roller coupled with another end of the BRC member and a motor for rotating the roller, the roller assembly being ascended while rolling the BRC member onto the roller when the motor is rotated in a first direction, and being descending while unrolling the BRC member from the roller when the motor is rotated in a second direction opposite to the first direction; and a panel guide part connected to the roller assembly and moved along with the roller assembly. The flexible display panel is rolled onto the panel guide part when the roller assembly and the panel guide part ascend, and is unrolled from the panel guide part when the roller assembly and the panel guide part descend.

Embodiments relate to a rollable display comprising a flexible display panel; at least one BRC member having one end coupled with an edge of the flexible display panel; a roller assembly having a roller coupled with another end of the BRC member and a motor for rotating the roller; and a panel guide part connected to another edge of the flexible display panel. The flexible display panel descends while rolling the BRC member onto the roller when the motor is rotated in a first direction and ascends while unrolling the BRC member from the roller when the motor is rotated in a second direction opposite to the first direction. The flexible display panel is rolled onto the panel guide part while descending and is unrolled from the panel guide part while ascending.

In embodiment, at least one of the BRC members is spaced apart from at least another of the BRC members.

In embodiment, the plurality of the BRC members are driven by one motor.

In embodiment, another end of the BRC member is coupled to the roller in a state of being unbent in the width direction of the BRC member.

In one embodiment, the rollable display further comprises an upper frame provided at the edge of the flexible display panel. The upper frame couples one end of BRC member to the edge of the flexible display panel in a state of being bent in the width direction.

In embodiment, the roller assembly includes a supporter having a predetermined curvature. The BRC member is bent at the predetermined curvature in the width direction while passing through the supporter.

In embodiment, the roller assembly includes a sub-roller opposite to the roller with the BRC member therebetween and rotating in conjunction with the rolling and unrolling of the BRC member. A rotation axis of the sub-roller is parallel to a rotation axis of the roller.

In embodiment, the panel guide part includes a guide rail having a spiral trajectory, and a guide shaft having a shape extending in a direction of the central axis which the flexible display panel is rolled with respect to and movably fastened to the guide rail. The guide shaft is coupled with another edge of the flexible display panel and guides the flexible display panel along the spiral trajectory of the guide rail.

In embodiment, the flexible display panel includes a portion protruding outward the guide shaft along the direction of the central axis. The panel guide part includes a guide roller in contact with the portion of the flexible display panel. A rotation axis of the guide roller is parallel to the central axis.

In embodiment, the panel guide part further includes bearings provided at both ends of the guide shaft. The bearing is movably coupled with the guide rail along the spiral trajectory of the guide rail.

In one embodiment, the rollable display further comprises a base member to which the roller assembly and the panel guide part are fixed.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Reference will now be made in detail to embodiments illustrated in the accompanying drawings, examples of which are illustrated in the accompanying drawings. Wherever possible, the same reference numbers will be used throughout the drawings to refer to the same or like parts. It will be appreciated that detailed description of known arts will be omitted if it is determined that the arts can mislead or otherwise obscure the description of embodiments of the disclosure.

Although terms including ordinal numbers such as "first" and "second" may be used to describe various components, the components are not limited by the terms. The terms are used only to distinguish one component from other components.

A display device according to this disclosure may be implemented based on displays such as a liquid crystal display (LCD), a field emission display (FED), a plasma display panel (PDP), an organic light-emitting display (OLED), an electrophoresis display (EPD), a quantum dot display (QDD), etc. For ease of explanation, an example will be provided in which a rollable display comprises an organic light-emitting diode (hereinafter, "OLED").

Figure 1:
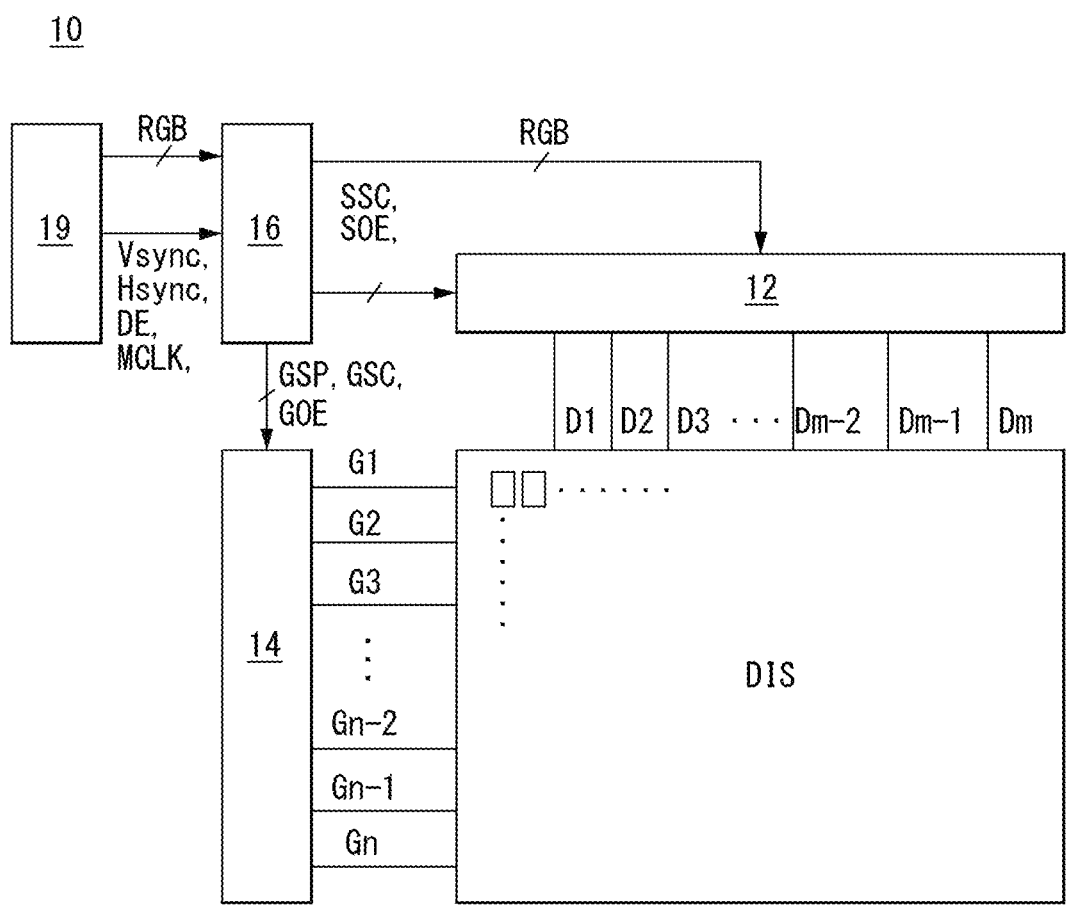
FIG. 1 is a block diagram schematically showing a rollable display, according to one or more embodiments of this disclosure.
Figure 2:
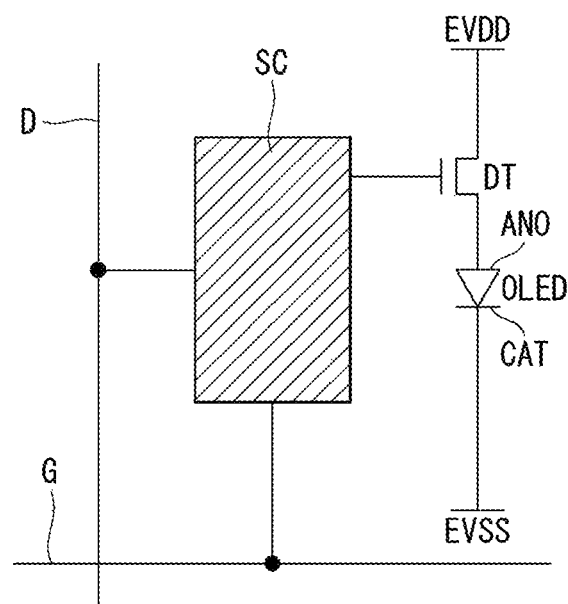
FIG. 2 is an equivalent circuit diagram schematically illustrating a configuration of a pixel of the rollable display shown in FIG. 1.
Figure 3:
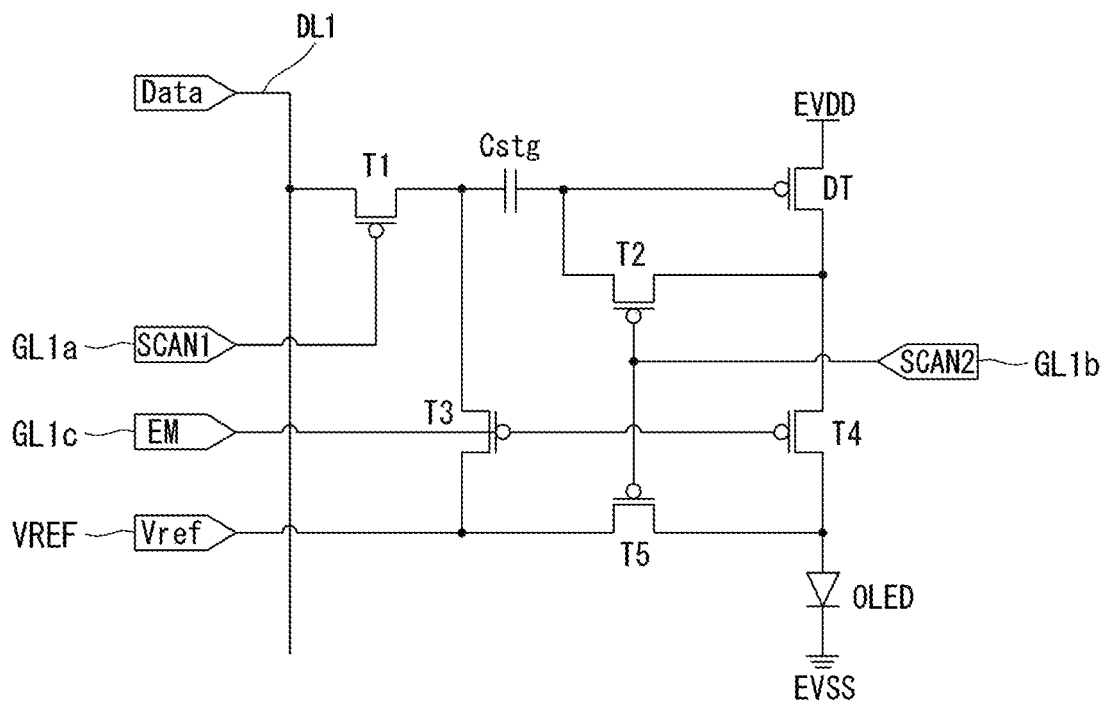
FIG. 3 is a circuit diagram specifically illustrating the pixel shown in FIG. 1.
Figure 4:
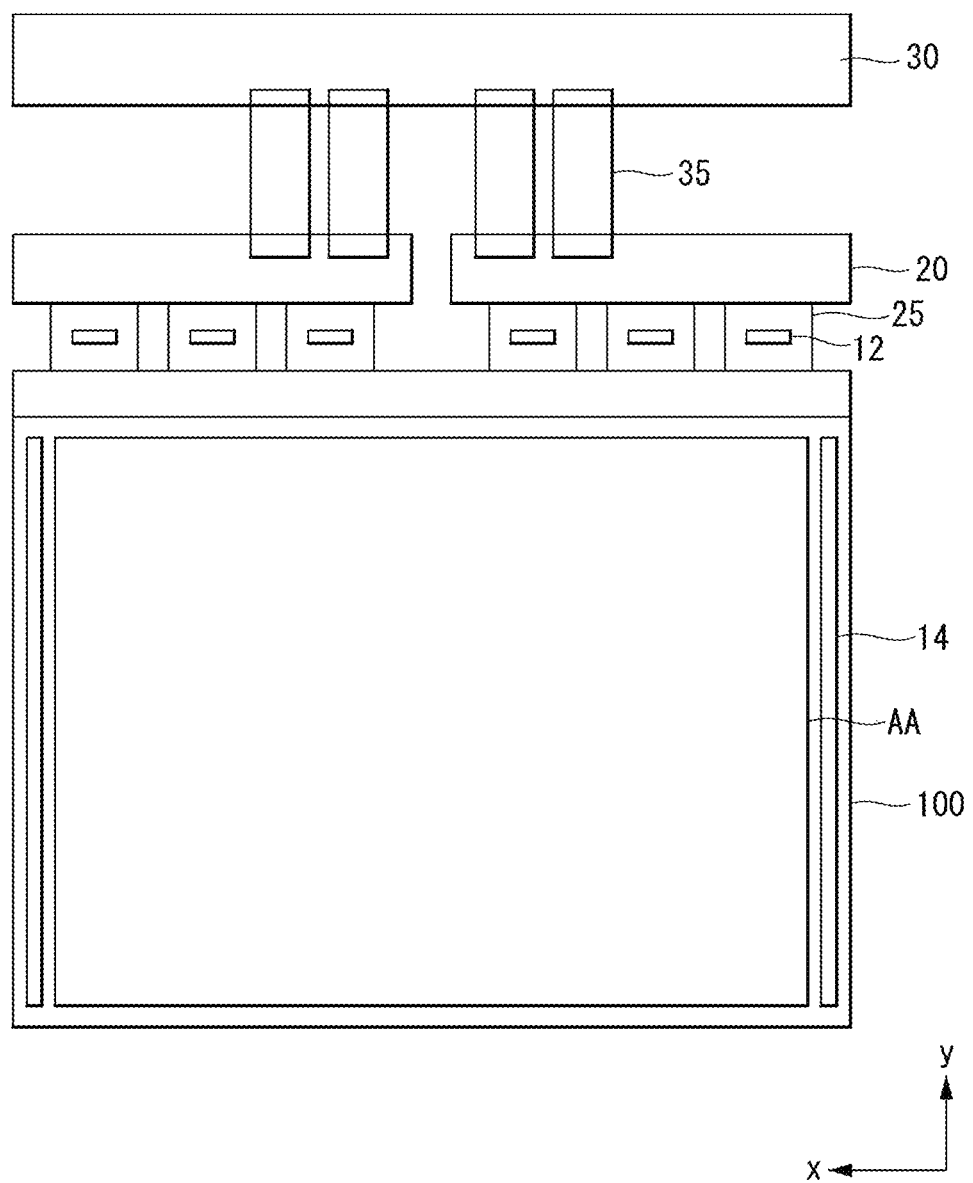
FIG. 4 is a planar view showing a flexible display panel implemented as a module, according to one or more embodiments.

FIG. 1 is a block diagram schematically showing a rollable display, according to one or more embodiments of this disclosure. FIG. 2 is an equivalent circuit diagram schematically illustrating a configuration of a pixel of the rollable display shown in FIG. 1. FIG. 3 is a circuit diagram specifically illustrating the pixel shown in FIG. 1. FIG. 4 is a planar view showing a flexible display panel implemented as a module, according to one or more embodiments.

Referring to FIG. 1, a rollable display 10 according to one or more embodiments of this disclosure comprises a display driver circuit and a flexible display panel DIS.

The display driver circuit comprises a data drive circuit 12, a gate drive circuit 14, and a timing controller 16, and writes video data voltages of an input image to pixels on the flexible display panel DIS. The data drive circuit 12 converts digital video data RGB received from the timing controller 16 to analog gamma compensating voltages and generates data voltages. The data voltages output from the data drive circuit 12 are supplied to data lines D1 to Dm. The gate drive circuit 14 sequentially supplies gate signals synchronized with the data voltages to gate lines G1 to Gm and selects pixels from the flexible display panel DIS to write the data voltages.

The timing controller 16 receives timing signals such as a vertical synchronization signal Vsync, a horizontal synchronization signal Hsync, a data enable signal DE, a main clock MCLK, etc., from a host system 19, and synchronizes the operation timings of the data drive circuit 12 and gate drive circuit 14. Data timing control signals for controlling the data drive circuit 12 comprise a source sampling clock SSC, a source output enable signal SOE, etc. Gate timing control signals for controlling the gate drive circuit 14 comprise a gate start pulse GSP, a gate shift clock GSC, a gate output enable signal GOE, etc.

The host system 19 may be implemented as any one of the following: a television system, a set-top box, a navigation system, a DVD player, a Blue-ray player, a personal computer PC, a home theater system, and a phone system. The host system 19 comprises a system-on-chip (SoC) with a scaler embedded in it, and converts digital video data RGB of an input image into a format suitable for display on the flexible display panel DIS. The host system 19 transmits the timing signals Vsync, Hsync, DE, and MCLK, along with the digital video data, to the timing controller 16.

The pixel array on the flexible display panel DIS comprises pixels formed in pixel areas defined by data lines D1 to Dm (m is a positive integer) and gate lines G1 to Gn (n is a positive integer). Each pixel comprises an OLED, which is a self-emissive element.

Referring further to FIG. 2, data lines D and gate lines G cross over each other on the flexible display panel DIS, and pixels are arranged in a matrix at the crossings of the data lines D and the gate lines G. Each pixel includes a driving thin film transistor (hereinafter, TFT) DT for controlling the amount of current flowing through the OLED, and a programming part SC for setting gate-source voltage of the driving TFT DT.

The programming part SC may comprise at least one switching TFT and at least one storage capacitor. The switching TFT turns on in response to a scan signal from a gate line G thereby applying a data voltage from the data line D to one electrode of the storage capacitor. The driving TFT DT adjusts the amount of light emitted from the OLED by controlling the amount of current supplied to the OLED based on charge quantity stored in the storage capacitor. The amount of light emitted by the OLED is proportional to the current supplied from the driving TFT DT. The pixel is connected to a high voltage source EVDD and a low voltage source EVSS and takes a high voltage and a low voltage from a power generator (not shown). The driving and switching TFTs of the pixel may be implemented as a p-type TFT or a n-type TFT. Also, a semiconductor layer for the TFTs of the pixel may include amorphous silicon, or polysilicon, or oxide. The OLED comprises an anode ANO, a cathode CAT, and an organic compound layer interposed between the anode ANO and the cathode CAT. The anode ANO is connected to the driving TFT DT.

Referring further to FIG. 3, the pixel may consist of six transistors T1 to T5 and DT and one capacitor Cstg (the six transistor and one capacitor structure may be referred to hereinafter as "6T1C"). However, the pixel structure in accordance with embodiments provided by this disclosure is not limited to the 6T1C structure. That is, this disclosure may use all types of OLED pixel structures that can adjust the current flowing through the OLED using the driving TFT.

The TFTs included in the pixels to be described below are the P-type TFT, for example, but this disclosure is not limited thereto and may be the N-type TFT. The positions of source and drain electrodes may vary depending on the type of the TFTs, so the source and drain electrodes may be called as a first electrode and a second electrode in the following description.

A first TFT T1 comprises a gate electrode connected to a 1a-th gate line GL1a, a first electrode connected to a first data line DL1, and a second electrode connected to one end of the storage capacitor Cstg. The first TFT T1 serves to transmit a data signal supplied through the first data line DL1 to the storage capacitor Cstg, in response to a 1a-th gate signal SCAN1.

A second TFT T2 comprises a gate electrode connected to a 1b-th gate line GL1b, a first electrode connected to a gate electrode of the driving TFT DT, and a second electrode connected to a second electrode of the driving TFT DT. The second TFT T2 connects the gate electrode and source electrode node of the driving TFT DT in a diode connection, in response to a 1b-th gate signal SCAN2.

A third TFT T3 comprises a gate electrode connected to a 1c-th gate line GL1c, a first electrode connected to a reference voltage line VREF, and a second electrode connected to one end of the storage capacitor Cstg. The third TFT T3 serves to supply a reference voltage Vref (or compensating voltage) to the one end of the storage capacitor Cstg, in response to a 1c-th gate signal EM.

A fourth TFT T4 comprises a gate electrode connected to the 1c-th gate line GL1c, a first electrode connected to the second electrode of the driving TFT DT, and a second electrode connected to the anode of the organic light-emitting diode OLED. The fourth TFT T4 serves to transmit driving current to the organic light-emitting diode OLED to make it emit light, in response to the 1c-th gate signal EM.

A fifth TFT T5 comprises a gate electrode connected to the 1b-th gate line GL1b, a first electrode connected to the reference voltage line VREF, and a second electrode connected to the anode of the organic light-emitting diode OLED. The fifth TFT T5 serves to supply the reference voltage Vref to the anode of the organic light-emitting diode OLED, in response to the 1b-th gate signal SCAN2.

The driving TFT DT comprises a gate electrode connected to the other end of the storage capacitor Cstg, a first electrode connected to a first power supply (or high voltage source) EVDD, and a second electrode connected to the first electrode of the fourth TFT T4. The driving TFT DT is turned on in response to a data voltage supplied from the storage capacitor Cstg and generates driving current to be supplied to the organic light-emitting diode OLED.

The organic light-emitting diode OLED comprises the anode connected to the second electrode of the fourth TFT T4 and a cathode connected to a second power supply (or low voltage source) EVSS. The organic light-emitting diode OLED emits light by the driving current supplied from the fourth TFT T4.

Further referring to FIG. 4, the timing controller (16 of FIG. 1), the data drive circuit 12, the gate drive circuit 14, and so on (e.g., the power generator, which is not shown) are electrically connected and attached to the flexible display panel 100, and may be implemented as a module.

The gate drive circuit 14 may be formed on the flexible display panel 100 in a GIP type. That is, the gate drive circuit 14 may be formed using a GIP (Gate In Panel) technology on a left side, a right side, or both the left and right sides of the display area AA so as to make it easy to roll or unroll the flexible display panel 100. However, this disclosure is not limited thereto.

A data printed circuit board (hereinafter, "data PCB") 20 is electrically connected to the flexible display panel 100 through a first connecting member 25. The first connecting member 25 may be a COF (Chip On Film) with the data drive circuit 12 mounted on it. However, this disclosure is not limited thereto. For example, the first connecting member 25 may be implemented by a TCP (Tape Carrier Package) technology which electrically connects the data PCB 20 to the flexible display panel 100.

The data PCB 20 is connected to a control board 30 through a second connecting member 35. The second connecting members 35 may consist of a plurality of members. The timing controller 16 shown in FIG. 1 may be mounted on the control board 30. The second connecting member 35 may be, an FFC (Flexible Flat Cable) but is not limited thereto. The control board 30 may be connected to the host system (19), the power generator, etc., by another connecting cable.

First Exemplary Embodiment

Figure 5:
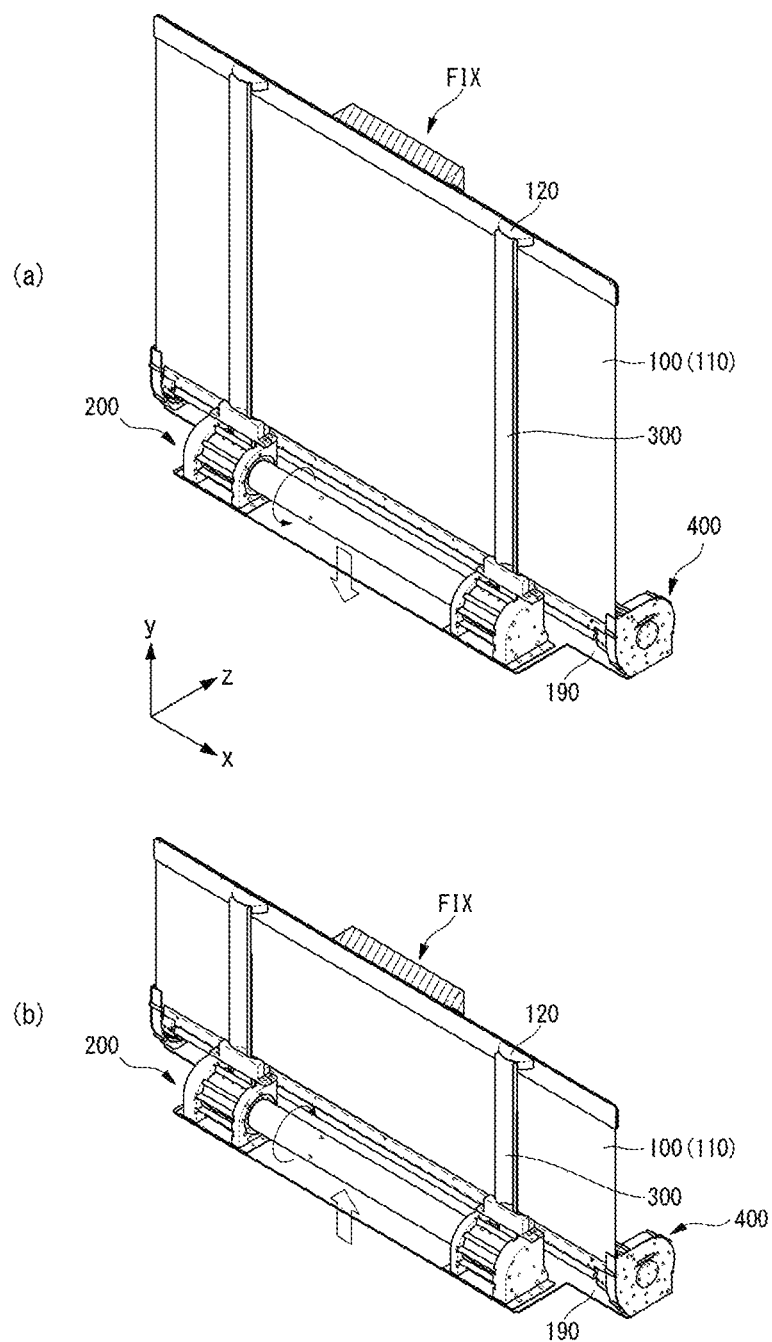
FIG. 5 is a perspective view illustrating a rollable display according to a first exemplary embodiment of this disclosure.
Figure 6:
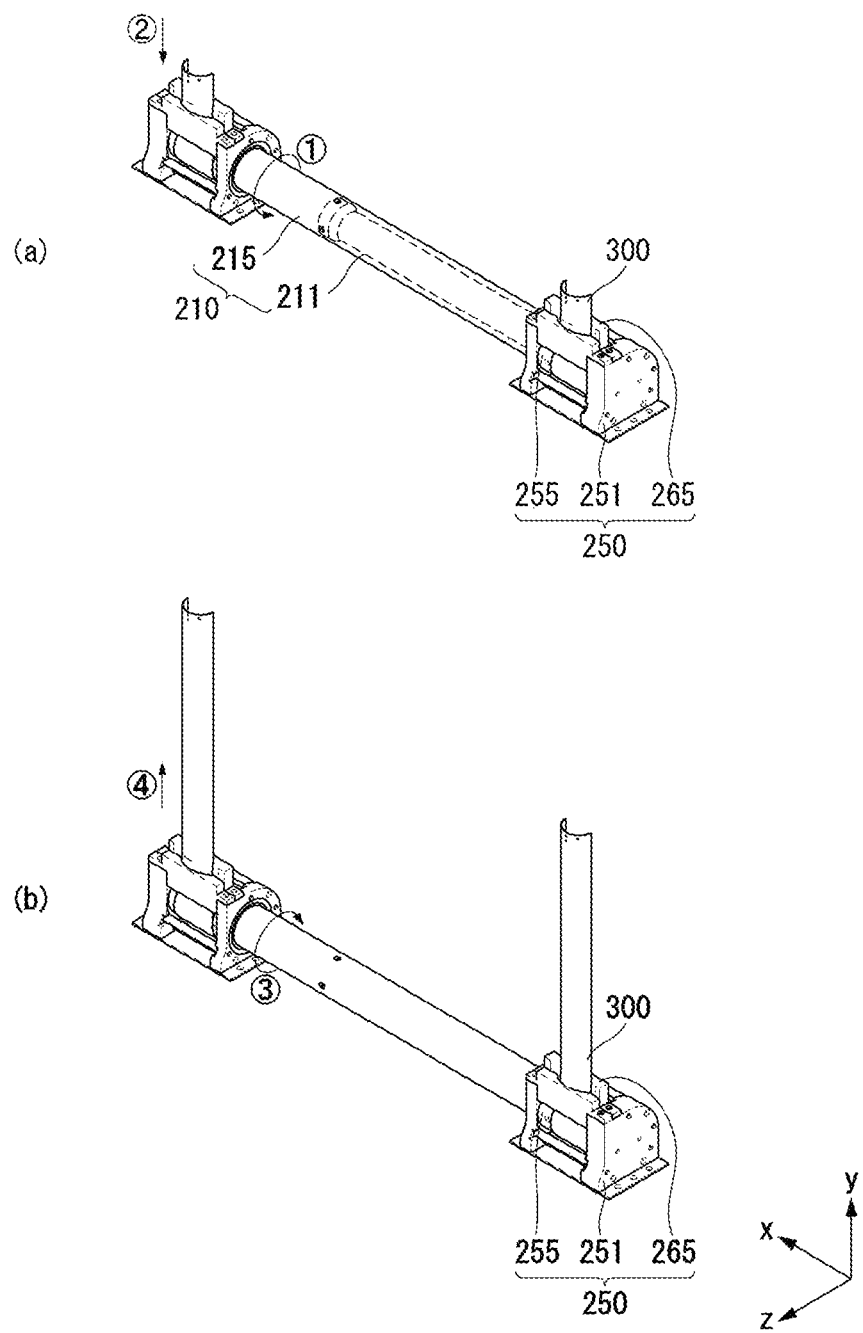
FIGS. 6 and 7 are perspective views illustrating the configuration and the operation of a roller assembly according to the first exemplary embodiment of this disclosure.
Figure 7:
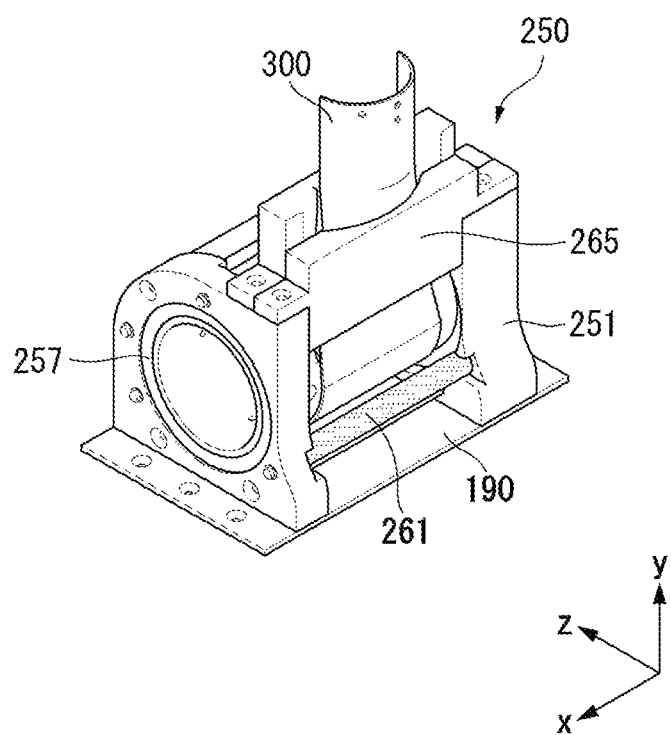
Figure 8:
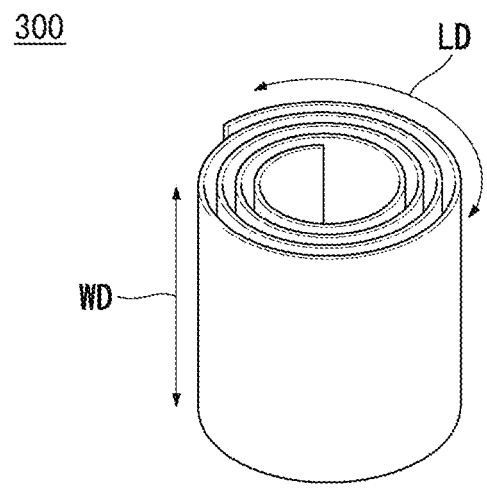
FIG. 8 is perspective view illustrating characteristics of a Bistable Reeled Composite (BRC) member, in accordance with one or more embodiments.
Figure 8:
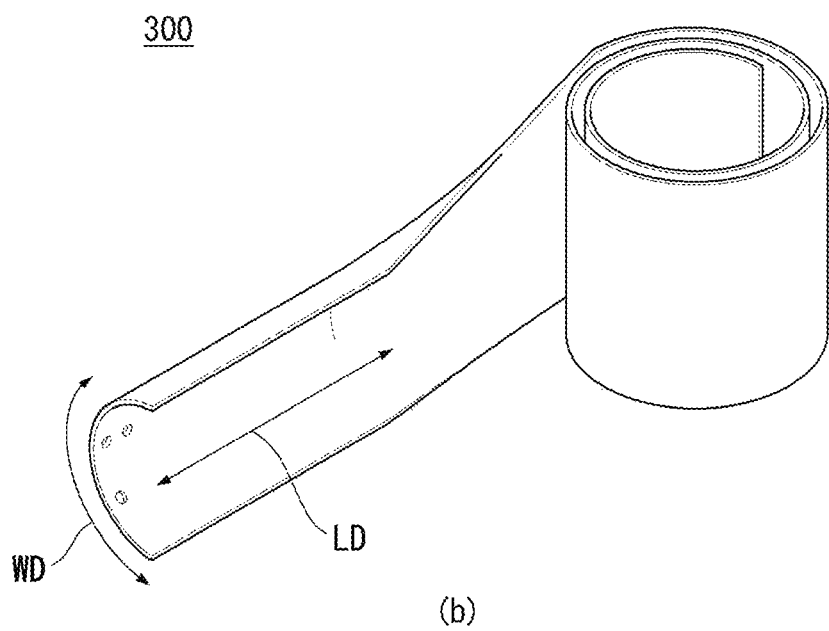
Figure 9:
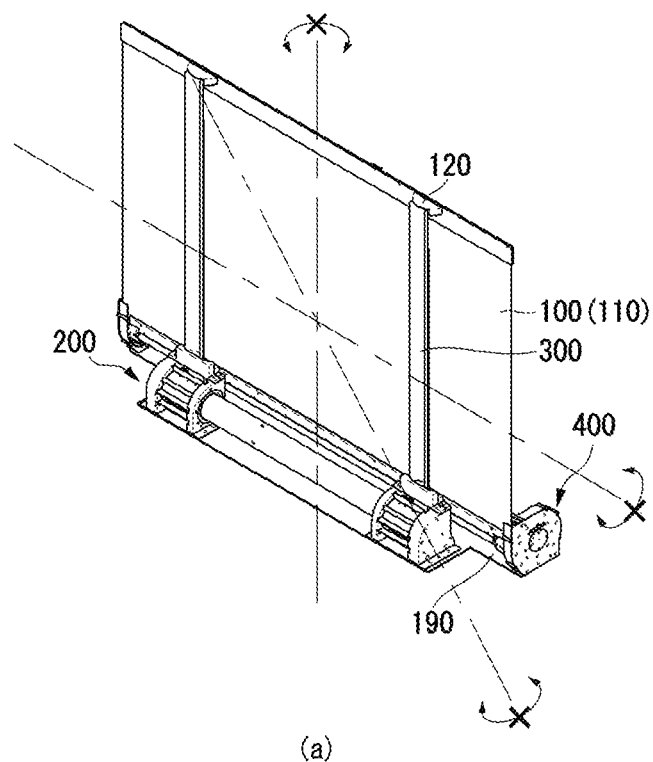
FIG. 9 is perspective view illustrating an example of the configuration of a roller assembly, in accordance with one or more embodiments.
Figure 9:
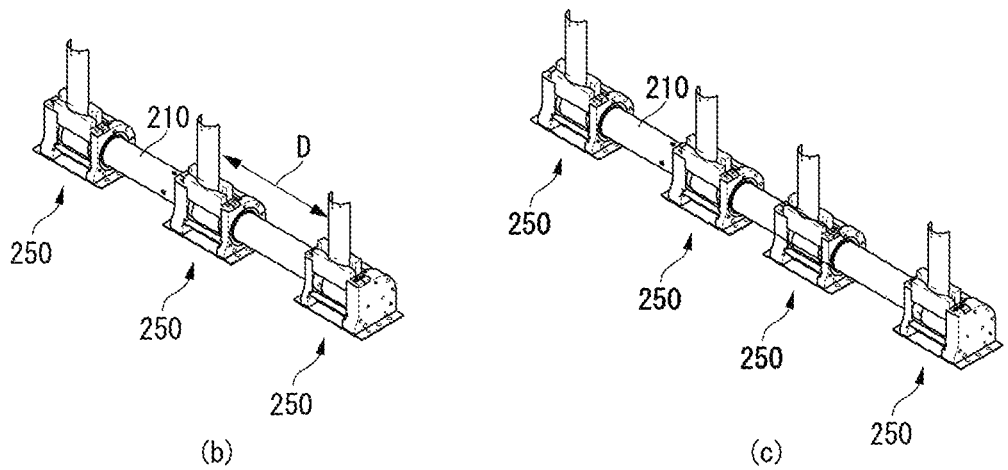
Figure 10:
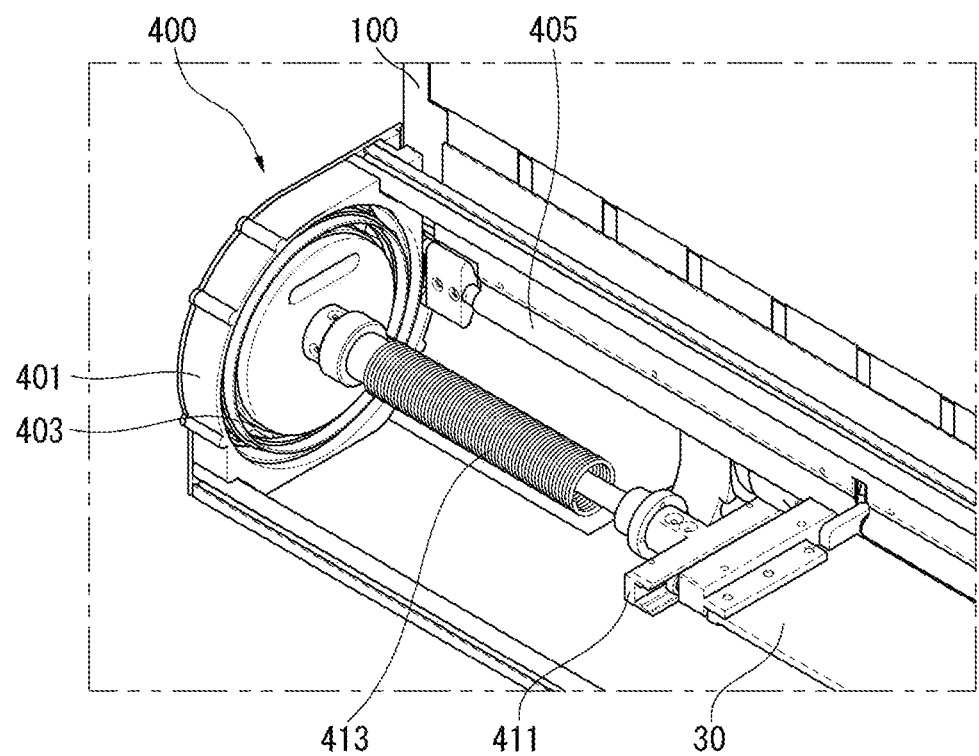
FIGS. 10 and 11 are views illustrating a configuration of a panel guide part, in accordance with one or more embodiments.
Figure 11:
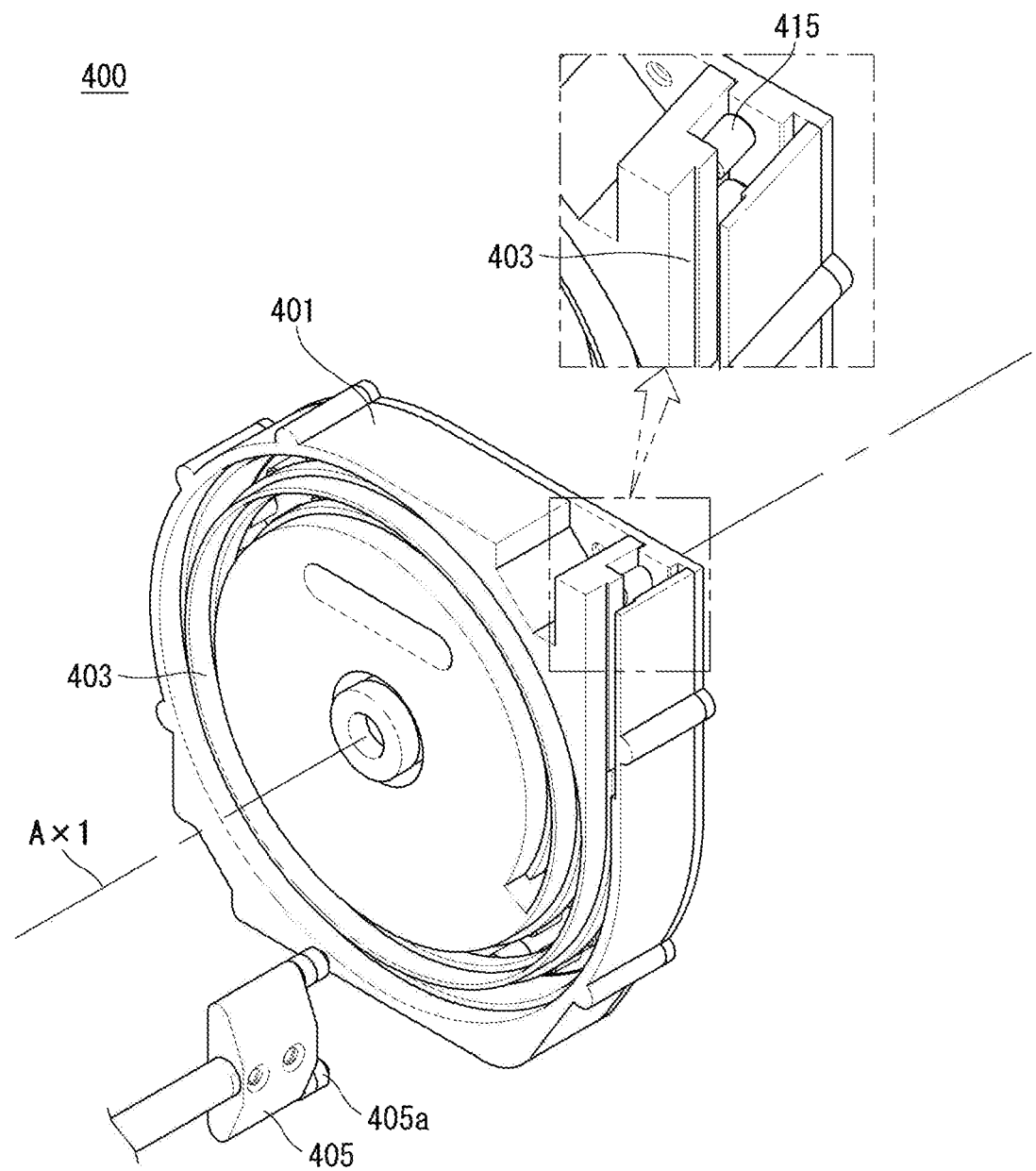

Referring to FIGS. 5 to 11, a rollable display according to a first exemplary embodiment of this disclosure will be described below. FIG. 5 is a perspective view illustrating a rollable display according to a first exemplary embodiment of this disclosure. FIGS. 6 and 7 are perspective views for explaining the configuration and the operation of a roller assembly according to a first exemplary embodiment of this disclosure. FIG. 8 is perspective view for explaining characteristics of a BRC member. FIG. 9 is perspective view for explaining an example of the configuration and a merit of a roller assembly. FIGS. 10 and 11 are views for explaining a configuration of a panel guide part.

Referring to FIGS. 5 to 7, the rollable display according to one or more embodiments of this disclosure comprises a flexible display panel 100, a roller assembly 200, a Bistable Reeled Composite (BRC) member 300, and a panel guide part 400 (which may be referred to herein as a "panel guide").

The flexible display panel 100 comprises a display area on which an input image is displayed. The user may recognize information output from the flexible display panel 100 through the display area. A front side of the flexible display panel 100 is one side of the flexible display panel 100 on which the display area is defined. By contrast, the rear side of the flexible display panel 100 is opposite to the front side of the flexible display panel. The user cannot recognize the display area through the rear side of the flexible display panel 100.

The figures illustrate an example in which the planar shape of the flexible display panel 100 is approximately rectangular, but this disclosure is not limited to this example. The planar shape of the flexible display panel 100 may include irregular shapes (or free-form shapes) such as a circular shape.

The flexible display panel 100 may be rolled or unrolled. That is, it is possible for the flexible display panel 100 to be rolled (or wound) and unrolled (or unwound) easily and repeatedly since it has flexibility. The flexible display panel 100 may be rolled in the front side direction of the flexible display panel 100 (hereinafter, "Inner rolling"), or rolled in the rear side direction of the flexible display panel 100 (hereinafter, "outer rolling"). For convenience of explanation, only the case in which the flexible display panel is rolled in the inner rolling manner will be described as an example.

The flexible display panel 100 may be rolled or unrolled and maintain a first state or second state. The first state may refer to the rolled state of the flexible display panel 100. In the first state, the display area of the flexible display panel 100 is not exposed to the outside so that the user cannot recognize the display area from the outside. In the first state, the display device may be turned off so that no input image is displayed.

The second state may refer to the unrolled state of the flexible display panel 100. In the second state, the flexible display panel 100 may remain approximately flat. In the second state, the user may recognize the display area of the flexible display panel 100 and get necessary information. In the second state, the display device may be turned on so that the input image is displayed.

The flexible display panel 100 may change from the first state to the second state or from the second state to the first state.

A back cover 110 may be further disposed on the rear side of the flexible display panel 100. The back cover 110 supports the rear side of the flexible display panel 100, and reinforces a rigidity of the flexible display panel 100. The back cover 110 may include a lightweight and high-strength material. For example, the back cover 110 may be made of any one of an aluminum, and plastic.

The roller assembly 200 is disposed at the bottom of the flexible display panel 100. The roller assembly 200 comprises a driving part (which may be referred to herein as a "driving unit") 210 and an elevating part 250. The driving part 210 comprises a first roller 215 and motor 211 for driving the first roller 215. The motor 211 may be accommodated in an inner space provided inside the first roller 215. The motor 211 may be connected to a power generator such as an external power source or an internal battery to receive power. The motor 211 generates a rotational force to provide a driving force to the first roller 215. The first roller 215 may receive the rotational force from the motor 211, which causes the first roller 215 to perform a rotation motion.

The elevating part 250 comprises a housing 251 and a second roller 255 that is rotatably coupled to the inside of the housing 251. The elevating part 250 is connected to the driving part 210 and receives the rotational force from the driving part 210. That is, the second roller 255 is connected to the first roller 215 and receives the rotational force from the first roller 215 to perform rotational motion. The second roller 255 may be formed as one body with the first roller 215. However, for ease of fastening, it may be preferable that the first roller 215 and the second roller 255 are separately formed and then coupled to each other.

One end (hereinafter, "upper end") of the BRC member 300 is coupled with an edge (hereinafter, "upper edge") of the flexible display panel 100. Another end (hereinafter, "lower end") of the BRC member 300 is fixed to the second roller 255. The upper edge of the flexible display panel 100 may be provided with an upper frame 120 for fixing the upper end of the BRC member 300.

The BRC member 300 may be rolled or unrolled along the circumference of the second roller 255, in conjunction with the rotational motion of the second roller 255. That is, when the second roller 255 rotates in a forward direction (①) with respect to the rotation axis x, the BRC member 300 is rolled onto the second roller 255(②) as shown in FIG. 6(a), and when the second roller 255 rotates in a backward direction with respect to the rotation axis x (③), the BRC member 300 is unrolled from the second roller 255 (④) as shown in FIG. 6(b).

The BRC member 300 can convert the rotational motion of the second roller 255 into a reciprocating motion. When the second roller 255 rotates in the forward direction, the BRC member 300 is rolled onto the second roller 255, and the roller assembly 200 moves upward in conjunction with the operation of the BRC member 300. When the second roller 255 rotates in the backward direction, the BRC member 300 is unrolled from the second roller 255, and the roller assembly 200 moves downward in conjunction with the operation of the BRC member 300. That is, the roller assembly 200 may go up and down in conjunction with the operation of the BRC member 300.

Referring to FIG. 8, when the BRC member 300 maintains an unbent (or, flat) state in a width direction WD, the BRC member 300 is rolled in a longitudinal direction LD. Conversely, when the BRC member 300 maintains a bent state in the width direction WD, the BRC member 300 is unrolled in the longitudinal direction LD since the BRC member 300 has rigidity in the longitudinal direction LD. The rigidity in the longitudinal direction LD of the BRC member 300 may be related to a degree bent in the width direction WD of the BRC member 300. In order to obtain a desired rigidity, the degree bent in the width direction WD may be appropriately selected. According to the preferred embodiment of this disclosure, it is possible to induce a state change (the rolled state from/to the unrolled state) of the BRC member 300 in the longitudinal direction LD by bending and unbending the BRC member 300 in the width direction WD.

The operation of bending or unbending the BRC member 300 in the width direction may be mechanically controlled. In one example, the mechanical control operation may be implemented by the second roller 255 and the upper frame 120. Since the lower end of the BRC member 300 is coupled to the second roller 255 in a state of being unbent in the width direction, the BRC member 300 may be rolled along the circumference of the second roller 255 while being unbent in the width direction.

The upper frame 120 can couple the upper end of the BRC member 300 to the upper edge of the flexible display panel 100 in the state bent in the width direction. Therefore, the BRC member 300 may be bent in the width direction while being unrolled from the second roller 255. A portion of the BRC member 300 bent in the width direction may support the flexible display panel 100 on the rear side of the flexible display panel 100 while maintaining a predetermined rigidity in the longitudinal direction. Accordingly, the unrolled flexible display panel 100 may maintain the second state.

In another example, the control operation may be implemented by further including a supporter 265 (which may be referred to herein as a "support member"). The supporter 265 may be fastened to the housing 251. The supporter 265 may be provided in a direction in which the BRC member 300 extends to the outside of the housing 251. The supporter 265 may guide the BRC member 300 so that the BRC member 300 is bent in the width direction when the BRC member 300 is unrolled from the second roller 255. A portion of the BRC member 300 bent in the width direction by passing through the supporter 265 may support the flexible display panel 100 on the rear side of the flexible display panel 100 because it has a predetermined rigidity in the longitudinal direction. Accordingly, the unrolled flexible display panel 100 may maintain the second state.

The supporter 265 may have a shape capable of bending the BRC member 300 in the width direction. For example, the supporter 265 may comprise a through hole that has a curved shape with a predetermined curvature. When the BRC member 300 is unrolled from the second roller 255, the BRC member 300 may be bent at predetermined curvature in the width direction as it passes through the through hole of the supporter 265.

The BRC member 300 may support the unrolled flexible display panel 100 on the rear side of the flexible display panel 100, and restrain or restrict so that the unrolled flexible display panel 100 is not shaken or twisted in any direction. Therefore, a portion of the flexible display panel 100 that is unrolled can maintain a flat state unless another external force is applied thereto.

In order to satisfy the above-described condition, it may be necessary to provide at least two elevating parts 250 as shown in FIG. 9. That is, a plurality of elevating parts 250 may be provided as needed. The BRC members 300 connected to the at least two elevating parts 250 are spaced apart from each other by a predetermined distance D in the rear side direction of the flexible display panel 100. The predetermined distance D may be appropriately selected so as to constrain the shaking and twisting of the unrolled flexible display panel 100.

The BRC members 300 may be selectively provided at appropriate positions to avoid mechanical interference with elements located on the rear side of the flexible display panel 100. This means that a design freedom can be improved compared to the case where the BRC member 300 is located at the center of the flexible display panel 100 when only one BRC member 300 is provided.

The preferred embodiment of this disclosure can be synchronized with the BRC members 300 by driving at least two BRC members 300 using one motor 211. That is, the preferred embodiment of this disclosure can prevent the deviation of the movement position of the BRC members 300 by simultaneously driving at least two BRC members 300 using one motor 211. Therefore, there is an advantage that the driving stability and the product reliability of the rollable display can be secured.

Referring to FIGS. 10 and 11, the panel guide part 400 is provided at another edge (hereinafter, "lower edge") of the flexible display panel 100. The panel guide part 400 is connected to the roller assembly 200 and moves up and down together with the roller assembly 200. The roller assembly 200 and the panel guide part 400 may be fixed on one base member 190 so as to be interconnected. The flexible display panel 100 is rolled onto the panel guide part 400 when the roller assembly 200 and the panel guide part 400 ascend, and is unrolled from the panel guide part 400 when the roller assembly 200 and the panel guide part 400 descend.

The panel guide part 400 comprises a housing 401, guide rails 403, a guide shaft 405, and a guide roller 415. The housing 401 may determine an appearance of the panel guide part 400. The guide rails 403 may be disposed on both sides of the panel guide part 400. Each of the guide rails 403 may have a spiral shape (or a coil shape). The guide rail 403 determines a movement path of the guide shaft 405.

The guide shaft 405 has a shape extending in the direction of a central axis AX1 (hereinafter, "the central axis") around which the flexible display panel 100 is rolled. The guide shaft 405 is coupled with the lower edge of the flexible display panel 100. Both ends of the guide shaft 405 are movably coupled with the guide rails 403, respectively. Bearings 405a may be coupled with both ends of the guide shaft 405 to facilitate movement of guide shaft 405 along the guide rails 403. The guide shaft 405 moves along a trajectory of the guide rail 403. The guide shaft 405 guides the flexible display panel 100 so that the flexible display panel 100 can be rolled or unrolled along the trajectory of the guide rail 403.

It is preferable that only bearing 405a occupying a relatively small space in comparison with the guide shaft 405 is inserted into the guide rail 403. In this case, the bearing 405a that is inserted into the guide rail 403 guides the flexible display panel 100 so that the flexible display panel 100 can be rolled or unrolled along the trajectory of the guide rail 403. Accordingly, it is possible to provide the panel guide part 400 with a compact design since the width of the guide rail 403 is reduced.

The flexible display panel 100 is rolled or unrolled along the trajectory of the guide rail 403 since the panel guide part 400 ascends or descends in conjunction with the vertical reciprocating movement of the roller assembly 200. That is, the flexible display panel 100 is rolled along the trajectory of the guide rail 403 when the roller assembly 200 and the panel guide part 400 ascend, and is unrolled along the trajectory of the guide rail 403 when the roller assembly 200 and the panel guide part 400 descend.

The flexible display panel 100 may be longer than the guide shaft 405 in the direction of the central axis AX1. A portion of the flexible display panel 100 protruding outward beyond an edge of the guide shaft 405 along the direction of the center axis AX1 is in contact with the guide roller 415. The guide roller 415 rotates in conjunction with the rolling and unrolling of the flexible display panel 100. The rotation axis of the guide roller 415 and the central axis AX1 are parallel to each other. The guide roller 415 guides the flexible display panel 100 so that it can be smoothly rolled and unrolled along the guide rail 403.

When the flexible display panel 100 is rolled and unrolled along the guide rail 403, a distance between the lower edge of the flexible display panel 100 and the central axis AX1 is changed, since the guide rail 403 has a spiral shape. Assuming that the control board 30 is provided in the panel guide part 400, the change of the distance between the lower edge of the flexible display panel 100 and the central axis AX1 may cause a problem that the connecting member connecting the flexible display panel 100 and the control board 30 is opened. In order to prevent the above-described problem, the preferred embodiment of this disclosure may further comprise a slider 411 for maintaining a constant distance between the control board 30 and the flexible display panel 100. The slider 411 is slidable in response to the change of the distance between the lower edge of the flexible display panel 100 and the central axis AX1.

The preferred embodiment of this disclosure may further comprise a torsion spring 413 that can apply a predetermined tension to the flexible display panel 100 to facilitate the rolling or unrolling operation of the flexible display panel 100. The torsion spring 413 may be provided to extend along the direction of the central axis AX1.

Figure 12:
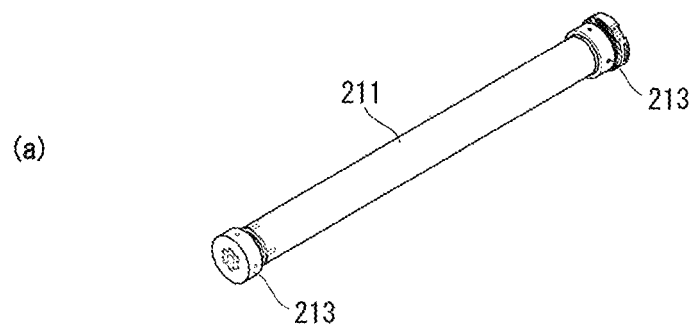
FIGS. 12 to 14 are views illustrating fastening processes of a roller assembly, in accordance with one or more embodiments.
Figure 12:
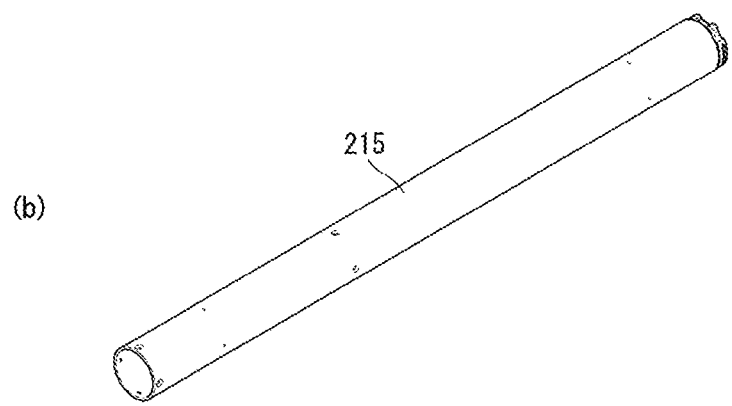
Figure 12:
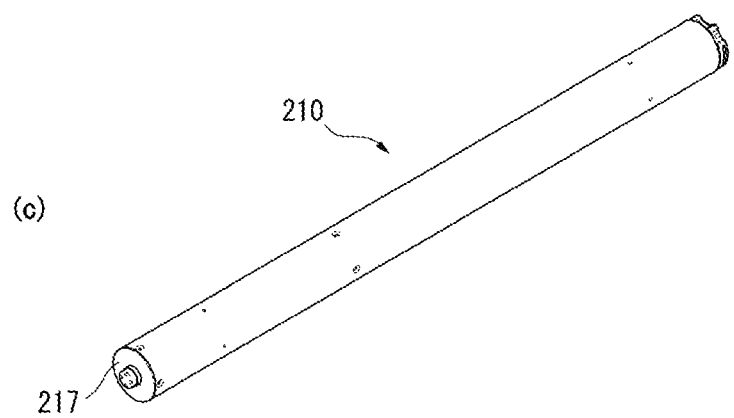
Figure 13:
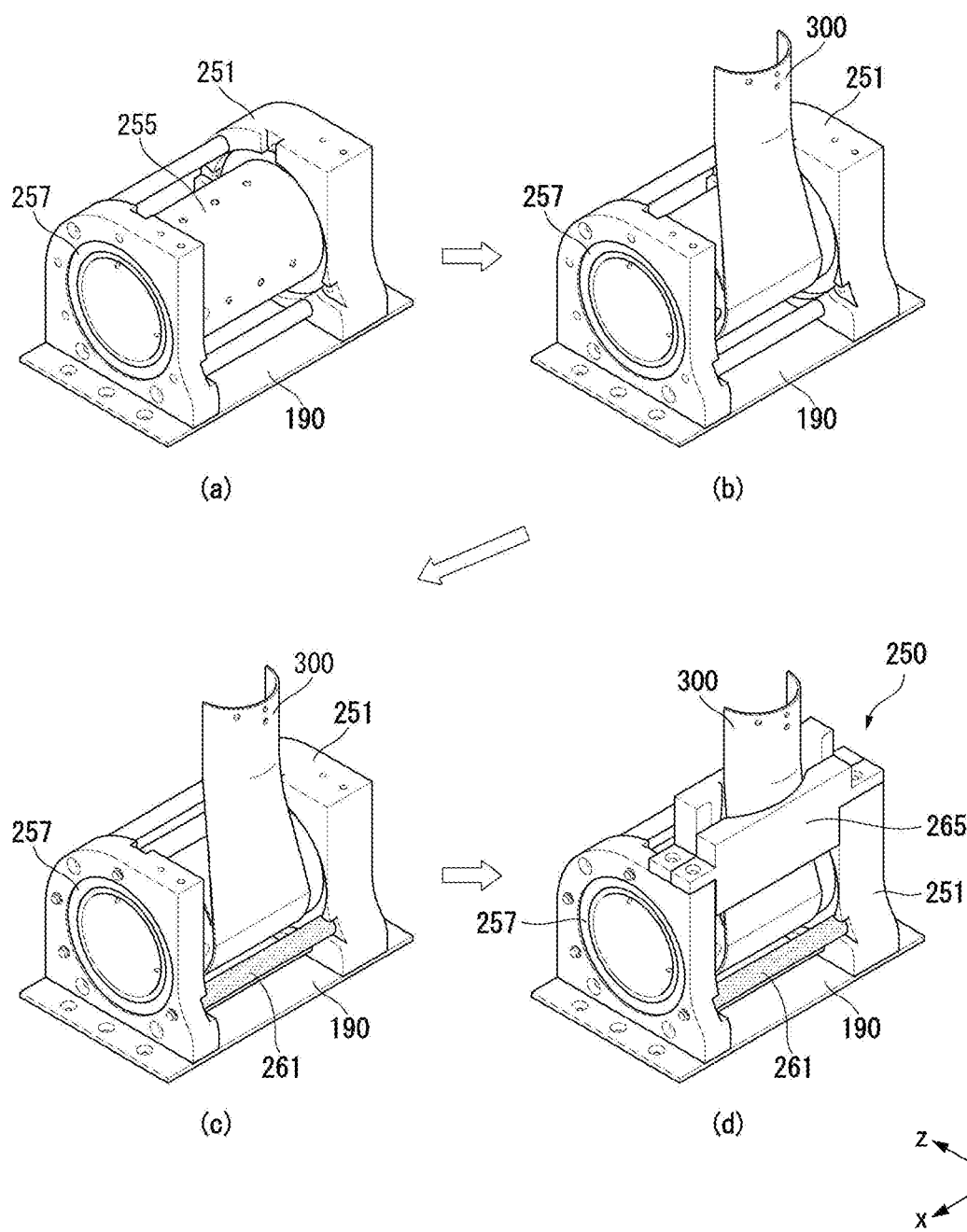
Figure 14:
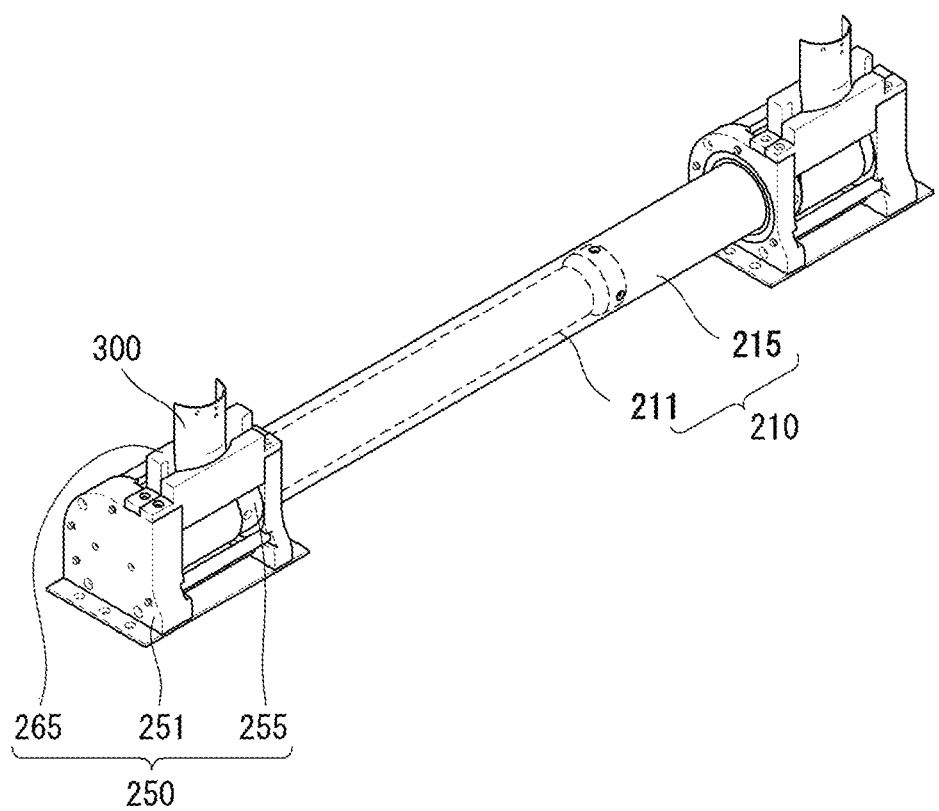

Referring to FIGS. 12 and 14, the fastening process of the roller assembly will be described below. FIGS. 12 to 14 are views for explaining the fastening processes of a roller assembly.

Referring to FIG. 12, the driving unit 210 comprises the motor 211 and the first roller 215. The motor 211 may be a tubular motor, but is not limited thereto. The motor 211 is accommodated in an inner space of the first roller 215. The motor 211 and the first roller 215 are connected through at least one fastening part 213. A rotational force from motor 211 is transferred to the first roller 215, and thus the first roller 215 can perform rotational motion. A bracket 217 may be provided on both ends of the first roller 215 to rotatably couple the driving part 210 and the elevating part 250. Thus, the driving part 210 is constructed.

Referring to FIG. 13, the elevating part 250 comprises the housing 251, the second roller 255, the BRC member 300, a sub-roller 261, and the supporter 265. The housing 251 may be provided on the base member 190. The second roller 255 is rotatably coupled to the inside of the housing 251. At least one bearing 257 may be provided between the second roller 255 and the housing 251 to facilitate the rotation of the second roller 255. At least one end of the second roller 255 is opened to be coupled with the first roller 215. The second roller 255 may be integrally formed with the first roller 215. However, for ease of coupling, it may be preferable that the first roller 215 and the second roller 255 are separately formed and then fastened to each other.

The lower end of the BRC member 300 is coupled with the outer circumference surface of the second roller 255. The lower end of the BRC member 300 fixed to the outer circumference surface of the second roller 255 maintains the unbent state in the width direction. The BRC member 300 is provided so as to be able to be rolled or unrolled along the circumference of the second roller 255 in conjunction with the rotational motion of the second roller 255.

At least one sub-roller 261 may be opposite to the second roller 255 with the BRC member 300 therebetween. That is, one side of the BRC member 300 is in contact with the outer circumference surface of the second roller 255, and the other side of the BRC member 300 is in contact with the outer circumference surface of the sub-roller 261. The BRC member 300 is rolled or unrolled along the circumstance of the second roller 255 in conjunction with the rotation of the second roller 255 and the sub-roller 261 rotates in conjunction with the rolling operation of the BRC member 300. The rotation axis of the second roller 255 and the rotation axis of the sub-roller 261 are parallel to each other and the second roller 255 and the sub-roller 261 are rotated in different directions. The sub-roller 261 may function to assist the second roller 255 so that the BRC member 300 may be maintained in the unbent state. The sub-roller 261 may function to guide the BRC member 300 to be smoothly rolled or unrolled around the second roller 255.

The supporter 265 may be fastened to the housing 251 to determine the extending direction of the BRC member 300. That is, the supporter 265 can guide the BRC member 300 to extend in a selected direction. The supporter 265 can guide the BRC member 300 as it is bent in the width direction when the BRC member 300 is unrolled. Accordingly, the BRC member 300 can have a predetermined rigidity in the longitudinal direction while passing through the supporter 265, and can extend in the selected direction. As thus, the elevating part 250 is constructed.

Referring to FIG. 14, the completed driving part 210 and the elevating part 250 are coupled to each other. That is, the first roller 215 of the driving part 210 can be fitted to the second roller 255 of the elevating part 250. As shown in the drawing, two or more elevating parts 250 may be coupled to one driving part 210. Thus, the roller assembly 200 to which the BRC member 300 is coupled is constructed.

The roller assembly 200 according to the preferred embodiment of this disclosure may be formed separately for each component and then may be easily assembled. In addition, the roller assembly 200, the panel guide part 400, and the flexible display panel 100 according to the preferred embodiment of this disclosure are separately formed and then they can be easily assembled to each other. Thus, there is an advantage in maintenance, management, and repair, and there is an advantage that usability can be improved. Also, in the preferred embodiment of this disclosure, the number of the elevating parts 250 provided in the driving part 210 can be easily changed, and the distance between the plurality of elevating parts 250 can be easily adjusted. Accordingly, there is an advantage that design freedom can be secured.

Second Exemplary Embodiment

Figure 15:
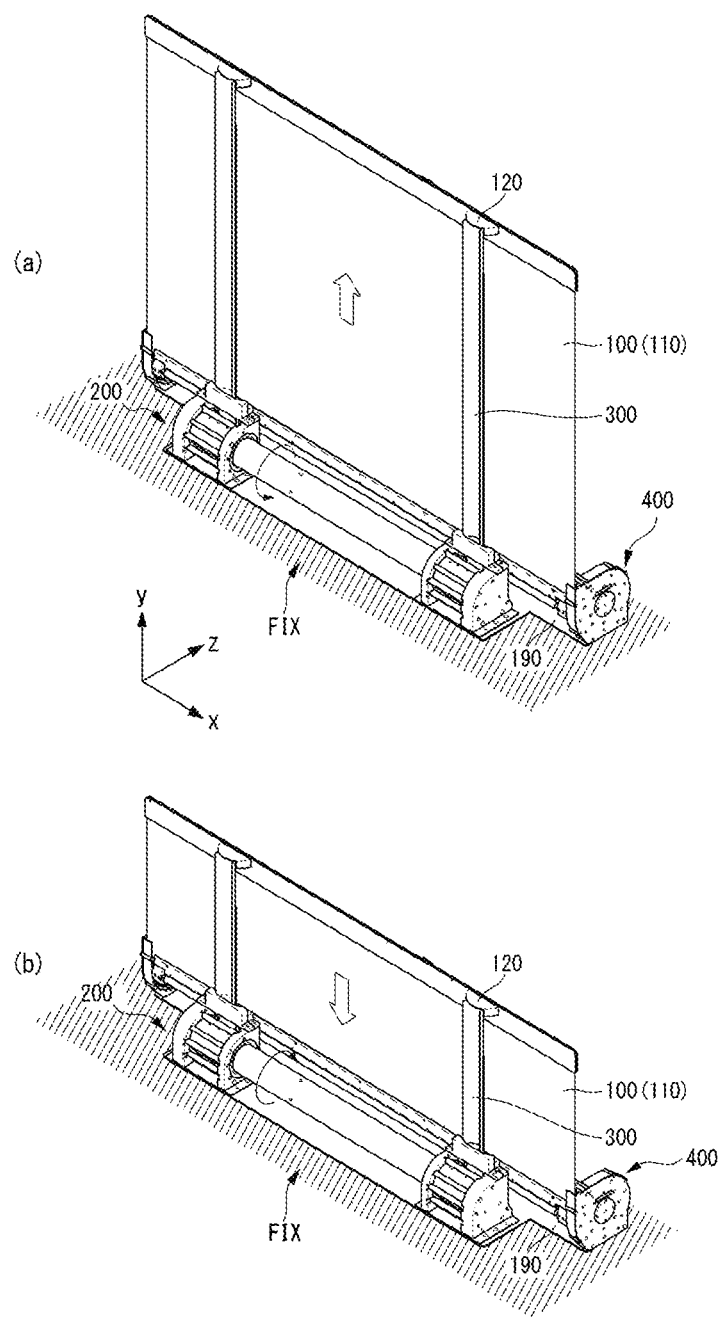
FIG. 15 is a perspective view illustrating a rollable display according to a second exemplary embodiment of this disclosure.
Figure 16:
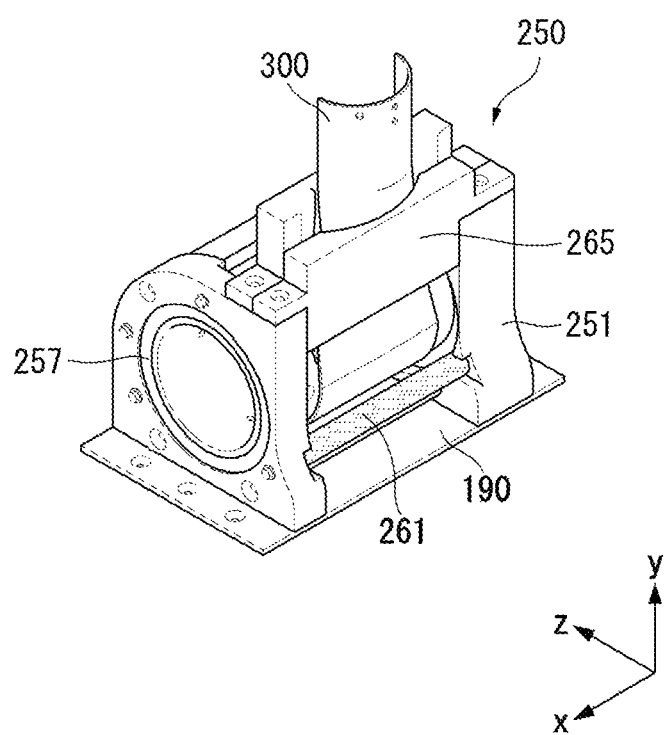
FIGS. 16 and 17 are views illustrating a configuration and the operation of a roller assembly according to the second exemplary embodiment of this disclosure.
Figure 17:
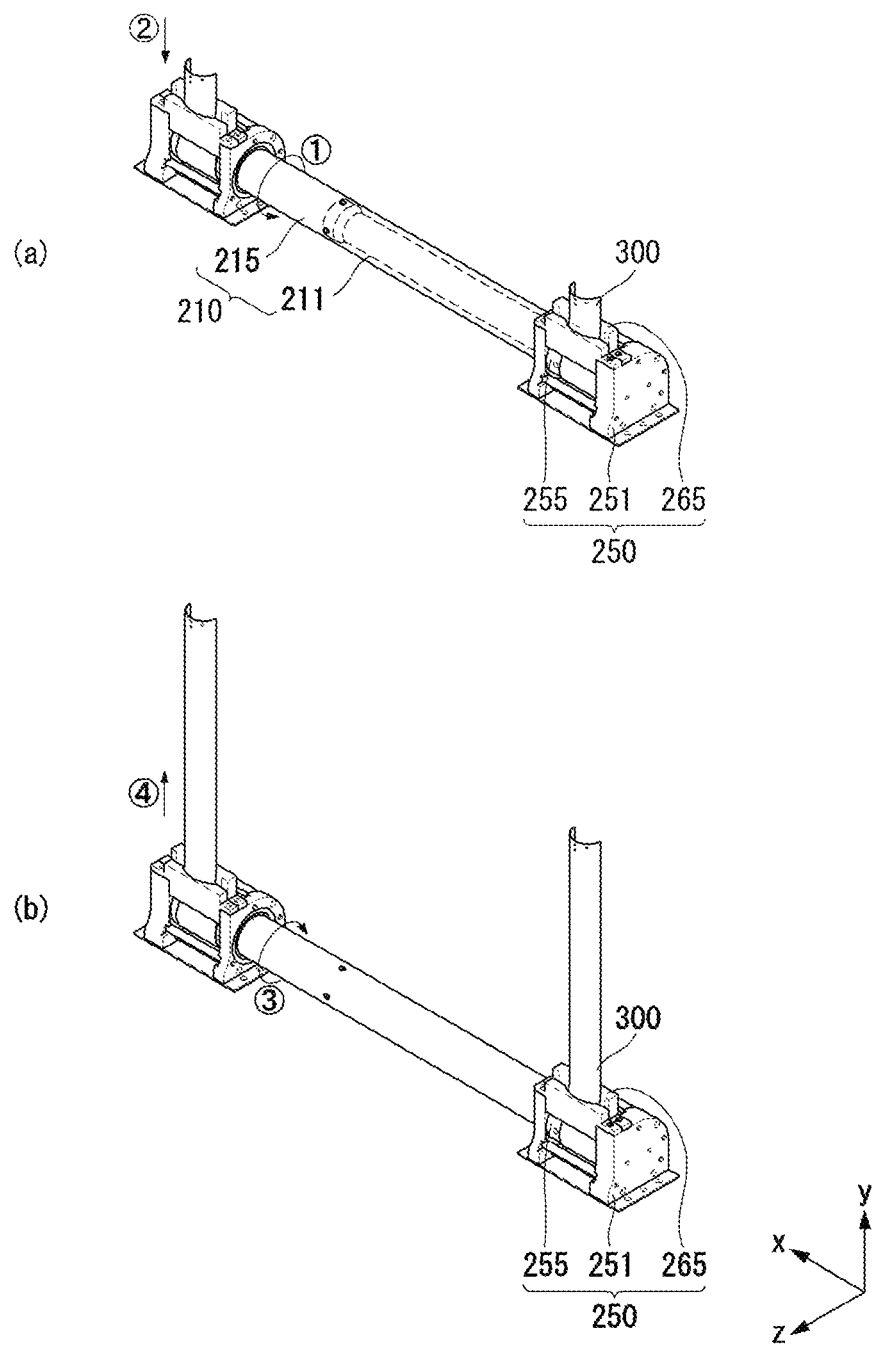

Referring to FIGS. 15 to 17, a rollable display according to a second exemplary embodiment of this disclosure will be described below. FIG. 15 is a perspective view illustrating a rollable display according to a second exemplary embodiment of this disclosure. FIGS. 16 and 17 are views for explaining a configuration and the operation of a roller assembly according to the second exemplary embodiment of this disclosure. In describing the second exemplary embodiments, the description of features or functionality overlapping with the first embodiment may be omitted.

The rollable display device according to this disclosure may be implemented in a structure in which the roller assembly 200 and the panel guide part 400 ascend or descend in conjunction with the movement of the BRC member 300 in a state where the position of the upper edge of the flexible display panel 100 is fixed. (First Exemplary Embodiment) Alternatively, the rollable display device according to this disclosure may be implemented in a structure in which the flexible display panel 100 ascend or descend in conjunction with the movement of the BRC member 300 in a state where the position of the roller assembly 200 and the panel guide part 400 is fixed. (Second Exemplary Embodiment)

A flexible display panel 100 may be rolled or unrolled, thereby maintaining a first state or second state. The first state may refer to the rolled state of the flexible display panel 100. If required, the flexible display panel 100 may change from the first state to the second state or from the second state to the first state.

A roller assembly 200 is disposed at the bottom of the flexible display panel 100. The roller assembly 200 may be fixed on one base member 190. The roller assembly 200 includes a driving part 210 and an elevating part 250. The driving part 210 includes a first roller 215 and a motor 211 for driving the first roller 215. The motor 211 generates a rotational force to provide a driving force to the first roller 215. The first roller 215 may receive the rotational force from the motor 211 to perform rotation motion.

The elevating part 250 comprises a housing 251 and a second roller 255 that is rotatably coupled to the inside of the housing 251. The elevating part 250 is connected to the driving part 210 and receives rotational force from the driving part 210. That is, the second roller 255 is connected to the first roller 215 and receives the rotational force from the first roller 215 to perform rotational motion.

The upper end of the BRC member 300 is coupled with the upper edge of the flexible display panel 100. The lower end of the BRC member 300 is coupled with the second roller 255. The upper edge of the flexible display panel 100 may have an upper frame 120 for fixing the upper end of the BRC member 300.

The BRC member 300 may be rolled or unrolled along the circumference of the second roller 255, in conjunction with the rotational motion of the second roller 255. That is, when the second roller 255 rotates in a forward direction (①) with respect to the rotation axis x, the BRC member 300 is rolled onto the second roller 255 (②) as shown in FIG. 17(a), and when the second roller 255 rotates in a backward direction with respect to the rotation axis x (③), the BRC member 300 is unrolled from the second roller 255 (④) as shown in FIG. 17(b).

The BRC member 300 can convert the rotational motion of the second roller 255 into a reciprocating motion. When the second roller 255 rotates in the forward direction, the BRC member 300 is rolled onto the second roller 255, and the flexible display panel 100 moves downward in conjunction with the operation of the BRC member 300. When the second roller 255 rotates in the backward direction, the BRC member 300 is unrolled from the second roller 255, and the flexible display panel 100 moves upward in conjunction with the operation of the BRC member 300. That is, the flexible display panel 100 may go up and down in conjunction with the operation of the BRC member 300.

A panel guide part 400 is disposed at the bottom of the flexible display panel 100. The panel guide part 400 may be fixed on a base member 190 along with the roller assembly 200. The flexible display panel 100 is rolled onto the panel guide part 400 while descending, and is unrolled from the panel guide part 400 while ascending.

Although embodiments have been described with reference to a number of illustrative embodiments thereof, it should be understood that numerous other modifications and embodiments can be devised by those skilled in the art that will fall within the spirit and scope of the principles of this disclosure. More particularly, numerous variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A rollable display comprising:
    a flexible display panel;
    at least one Bistable Reeled Composite (BRC) member having a first end mechanically coupled to a first edge of the flexible display panel, the BRC member being rollable along a longitudinal direction between the first end and a second end opposite the first end, the BRC member having a bend along a width of the BRC member in an unrolled state and being unbent along the width in a rolled state;
    a roller assembly including a roller mechanically coupled to the second end of the BRC member, and a motor for rotating the roller, the roller assembly being movable to ascend with respect to the first edge of the flexible display panel while rolling the BRC member onto the roller when the motor is rotated in a first direction, and to descend with respect to the first edge of the flexible display panel while unrolling the BRC member from the roller when the motor is rotated in a second direction opposite to the first direction; and
    a panel guide connected to the roller assembly and movable in conjunction with the roller assembly;
    wherein the flexible display panel is rolled onto the panel guide when the roller assembly and the panel guide ascend, and is unrolled from the panel guide when the roller assembly and the panel guide descend, and
    wherein the BRC member has a length between the roller assembly and the first edge of the flexible display panel, the length of the BRC member decreases when the roller assembly and the panel guide ascend, and the length of the BRC member increases when the roller assembly and the panel guide descend, and
    wherein the panel guide includes:
        a guide rail that defines a spiral trajectory; and
        a guide shaft having a shape extending in a direction of a central axis, the flexible display panel being rollable with respect to the central axis, the guide shaft movable fastened to the guide rail,
        wherein the guide shaft is coupled to a second edge of the flexible display panel, the second edge being opposite from the first edge, and the guide shaft guides the flexible display panel along the spiral trajectory of the guide rail.

2. The rollable display of claim 1, comprising a plurality of BRC members, wherein at least one of the BRC members is spaced apart from at least one other of the BRC members.

3. The rollable display of claim 2, wherein each of the plurality of BRC members is driven by the motor.

4. The rollable display of claim 1, wherein the second end of the BRC member is coupled to the roller in an unbent state along the width of the BRC member.

5. The rollable display of claim 4, further comprising an upper frame attached to the first edge of the flexible display panel, wherein the upper frame mechanically couples the first end of the BRC member to the first edge of the flexible display panel, with the BRC member being in a bent state along the width of the BRC member.

6. The rollable display of claim 4, wherein the roller assembly includes a support member having a fixed curvature,
wherein the BRC member is bent to have the fixed curvature along the width of the BRC member while passing through the support member.

7. The rollable display of claim 1, wherein the roller assembly includes a sub-roller opposite to the roller, the BRC member is positioned between the roller and the sub-roller, and the sub-roller rotates in conjunction with the rolling and unrolling of the BRC member,
wherein a rotation axis of the sub-roller is parallel to a rotation axis of the roller.

8. The rollable display of claim 1, wherein the flexible display panel includes a portion protruding outward beyond an edge of the guide shaft along the direction of the central axis,
wherein the panel guide includes a guide roller in contact with the protruding portion of the flexible display panel, and
wherein a rotation axis of the guide roller is parallel to the central axis.

9. The rollable display of claim 1, wherein the panel guide further includes bearings provided at respective ends of the guide shaft,
wherein the bearings are movably coupled to the guide rail along the spiral trajectory of the guide rail.

10. The rollable display of claim 1, further comprising a base member to which the roller assembly and the panel guide are fixed.

11. A rollable display comprising:
a flexible display panel;
at least one Bistable Reeled Composite (BRC) member having a first end mechanically coupled to a first edge of the flexible display panel, the BRC member being rollable along a longitudinal direction between the first end and a second end opposite the first end, the BRC member having a bend along a width of the BRC member in an unrolled state and being unbent along the width in a rolled state;
a roller assembly including a roller mechanically coupled to the second end of the BRC member, and a motor for rotating the roller; and
a panel guide connected to a second edge of the flexible display panel,
wherein the first edge of the flexible display panel descends with respect to the panel guide while rolling the BRC member onto the roller when the motor is rotated in a first direction and ascends with respect to the panel guide while unrolling the BRC member from the roller when the motor is rotated in a second direction opposite to the first direction,
wherein the flexible display panel is rolled onto the panel guide while descending and is unrolled from the panel guide while ascending, and
wherein the BRC member has a length between the roller assembly and the first edge of the flexible display panel, the length of the BRC member decreases while the first edge of the flexible display panel descends with respect to the panel guide, and the length of the BRC member increases while the first edge of the flexible display panel ascends with respect to the panel guide, and
wherein the panel guide includes:
a guide rail that defines a spiral trajectory; and
a guide shaft having a shape extending in a direction of a central axis, the flexible display panel being rollable with respect to the central axis, the guide shaft movably fastened to the guide rail,
wherein the guide shaft is coupled to the second edge of the flexible display panel, and guides the flexible display panel along the spiral trajectory of the guide rail.

12. The rollable display of claim 11, comprising a plurality of BRC members, wherein at least one of the BRC members is spaced apart from at least one other of the BRC members.

13. The rollable display of claim 12, wherein each of the plurality of the BRC members is driven by the motor.

14. The rollable display of claim 11, wherein the second end of the BRC member is coupled to the roller in an unbent state along the width of the BRC member.

15. The rollable display of claim 14, further comprising an upper frame attached to the first edge of the flexible display panel,
wherein the upper frame mechanically couples the first end of the BRC member to the first edge of the flexible display panel, with the BRC member being in a bent state along the width of the BRC member.

16. The rollable display of claim 14, wherein the roller assembly includes a support member having a fixed curvature,
wherein the BRC member is bent to have the fixed curvature along the width of the BRC member while passing through the support member.

17. The rollable display of claim 11, wherein the roller assembly includes a sub-roller opposite to the roller, the BRC member is positioned between the roller and the sub-roller, and the roller rotates in conjunction with the rolling and unrolling of the BRC member,
wherein a rotation axis of the sub-roller is parallel to a rotation axis of the roller.

18. The rollable display of claim 11, wherein the flexible display panel includes a portion protruding outward beyond an edge of the guide shaft along the direction of the central axis,
wherein the panel guide includes a guide roller in contact with the protruding portion of the flexible display panel, and
wherein a rotation axis of the guide roller is parallel to the central axis.

19. The rollable display of claim 11, wherein the panel guide further includes bearings provided at respective ends of the guide shaft,
wherein the bearings are movably coupled with the guide rail along the spiral trajectory of the guide rail.

20. The rollable display of claim 11, further comprising a base member to which the roller assembly and the panel guide are fixed.

* * * * *